United States Patent [19]

Karavakis et al.

[11] Patent Number: 5,663,106
[45] Date of Patent: Sep. 2, 1997

[54] METHOD OF ENCAPSULATING DIE AND CHIP CARRIER

[75] Inventors: Konstantine Karavakis, Coram, N.Y.; Thomas H. Distefano, Monte Sereno, Calif.; John W. Smith, Jr., Austin, Tex.; Craig Mitchell, San Jose, Calif.

[73] Assignee: Tessera, Inc., San Jose, Calif.

[21] Appl. No.: 246,113

[22] Filed: May 19, 1994

[51] Int. Cl.$^6$ .................. H01L 21/56; H01L 21/60
[52] U.S. Cl. ............ 29/841; 257/791; 264/272.17; 438/126; 438/127
[58] Field of Search ................... 437/211, 224; 427/96; 29/841; 257/791

[56] References Cited

U.S. PATENT DOCUMENTS

| | | | |
|---|---|---|---|
| 4,012,766 | 3/1977 | Phillips et al. | 257/670 |
| 4,312,116 | 1/1982 | Moser et al. | 437/205 |
| 4,616,412 | 10/1986 | Schroeder | 29/827 |
| 4,701,999 | 10/1987 | Palmer | 437/211 |
| 4,913,930 | 4/1990 | Getson | 437/211 X |
| 4,918,811 | 4/1990 | Eichelberger et al. | 437/209 X |
| 4,999,319 | 3/1991 | Hamano et al. | 437/211 X |
| 5,037,779 | 8/1991 | Whalley et al. | 437/211 |
| 5,120,678 | 6/1992 | Moore et al. | 437/211 X |
| 5,148,265 | 9/1992 | Khandros et al. | 257/773 |
| 5,148,266 | 9/1992 | Khandros et al. | 257/773 |
| 5,193,732 | 3/1993 | Interrante et al. | 228/1.1 |
| 5,252,784 | 10/1993 | Asai et al. | 174/267 |
| 5,258,330 | 11/1993 | Khandros et al. | 437/209 |
| 5,304,252 | 4/1994 | Condra et al. | 134/2 |
| 5,304,512 | 4/1994 | Arai et al. | 437/211 |
| 5,336,931 | 8/1994 | Juskey et al. | 437/211 X |

*Primary Examiner*—Richard D. Lovering
*Attorney, Agent, or Firm*—Lerner, David, Littenberg, Krumholz & Mentlik

[57] ABSTRACT

A method of packaging a semiconductor chip assembly includes the encapsulation of the same after establishing an encapsulation area and providing a physical barrier for protecting the terminals of a chip carrier. An alternative or supplement to providing a physical barrier is to provide a preform of an encapsulation material which includes a predetermined volume of such material so that only the encapsulation area is filled. For a semiconductor chip assembly which does not yet have an elastomeric layer, a method of simultaneously forming such an elastomeric layer and encapsulating a semiconductor chip assembly is also provided.

47 Claims, 5 Drawing Sheets

METHOD OF ENCAPSULATING DIE AND CHIP CARRIER

TECHNICAL FIELD

The present invention relates generally to a method of encapsulating a semiconductor chip assembly, and more specifically to a method of encapsulating a semiconductor chip assembly within a ring or a can, while protecting the terminals on the chip carrier.

BACKGROUND OF THE INVENTION

A semiconductor chip assembly may include a chip carrier which includes a dielectric layer overlying the front surface of the chip, with an array of terminals or "bumps" on the dielectric layer, and leads electrically connected to the terminals, and a semiconductor chip or "die". The bumps in the chip carrier are connected via the leads to contacts on the die. Such a chip assembly typically is used by placing it on a circuit board or other circuit panel and electrically connecting the terminals on the chip carrier to the panel as by soldering.

It is often desirable to more effectively "package" a semiconductor chip assembly so that it can be handled with less fear of damage to the assembly so that a heat sink can be married with the semiconductor chip or both. However, if a semiconductor chip assembly is to be so packaged for these or other purposes, the utmost care must be taken during the packaging process to avoid affecting the integrity of the terminals on the chip carrier. In particular, it is important to avoid contaminating the terminals on the chip carrier with the encapsulant.

Accordingly, a method of controlling the encapsulation of a semiconductor chip assembly, with or without an elastomeric pad or layer, such that the integrity of the terminals and leads are not affected is desirable.

SUMMARY OF THE INVENTION

The present invention provides a method of controlling encapsulation of a semiconductor chip assembly, as well as providing a method of simultaneously forming elastomeric layer and controlling such encapsulation.

In accordance with one embodiment of the present invention, a semiconductor chip assembly or other component having a top layer with an array of exposed terminals is encapsulated by placing it in an encapsulant barrier next to the semiconductor chip assembly such that it at least partially defines an encapsulation area, and providing a protective barrier for protecting the exposed terminals on the top layer during encapsulation. Encapsulation material is introduced into the encapsulation area, and by reason of the protective barrier, it is prevented from affecting the integrity of the exposed terminals. It is noted that the present invention contemplates the employment of the steps in any suitable order.

Preferably, the encapsulation material is introduced in a liquid form, and is subsequently hardened by any suitable means of curing the encapsulation materials. In another embodiment of the present invention, the encapsulation material can be disposed in the encapsulation area as a preform, either before or after the protective barriers associated with the exposed terminals and before or after the encapsulant barrier is placed adjacent to the semiconductor chip assembly. The preform of the encapsulation material can then be liquified by any suitable means so that the encapsulation material flows throughout the encapsulation area or a desired part of the encapsulation area.

In the preferred embodiment, the encapsulant barrier is at least a portion of a can which will form part of the encapsulation. The can is preferably made of a material which is high in thermal conductivity, such as aluminum. In another embodiment, however, the encapsulant barrier can be a ring which will remain as part of the encapsulation, but will not provide a heat sinking base. In this instance, other suitable heat sinking arrangements, or none at all, might be employed. In yet another embodiment, the encapsulant barrier can merely be a mold which will be removed after encapsulation.

It may also be desirable to provide the encapsulant barrier with means for allowing the encapsulation material to flow out of the encapsulation area and away from the exposed terminals. This might be in the form of a lowered wall, a lowered wall section, or holes provided in the walls of the can or other encapsulant barrier.

The present invention also contemplates the positioning of the semiconductor chip assembly within a can or other encapsulant barrier by means of positioning or centering means in the can.

Preferably, the protective barrier utilized in the present invention is a solder mask which provides an array of terminal holes which correspond to the array of exposed terminals on the top layer of the semiconductor chip assembly. Preferably, the terminal holes are sized to tightly receive the terminals or bumps so that the terminals are surrounded by the dielectric material of which solder mask is made. However, larger terminal holes can be provided, or, in the alternative, a large opening can be provided in the solder mask so that the entire array of terminals are exposed in such large opening.

Preferably, the solder mask is vacuum laminated to the top layer of the semiconductor chip assembly. More preferably, the solder mask is vacuum laminated not only to the top layer of the semiconductor chip assembly but also to the top side of the encapsulant barrier (the top side of the can, ring or mold walls). This arrangement, in many instances and at least with respect to the use of certain cans or molds, will fully enclose the encapsulation area, although the encapsulation area need not be so defined for the purposes of the present invention. In other words, the encapsulation area only need be partially bounded by the chip assembly, solder mask and encapsulant barrier. However, in the instance where it is fully enclosed or fully bounded by these components, it is desirable to provide a fill hole through which the encapsulation material can be injected into the encapsulation area, and in some instances, it may be preferable to utilize or provide a vent hole to prevent air from becoming entrapped in the encapsulation area.

In many instances, the encapsulation area is defined such that inversion of the encapsulant barrier, protected barrier and semiconductor assembly will facilitate the introduction of the encapsulation material.

In other embodiments of the present invention, the protective barrier can be a dam, a cap, a cover, or any other means which protects the exposed terminals on the top layer of the semiconductor chip assembly. This could also include a flexible covering member which, upon the application of pressure, will deform into engagement with the top layer around the exposed terminals to protect the same.

It should be understood that the encapsulant barrier may be provided in contact with the semiconductor chip or at a distance from the semiconductor chip, although in most cases it would be preferable to have it at a distance from the semiconductor chip. In the former instance, however, the assembly to be encapsulated may be structured such that the encapsulant barrier should be in contact with the semiconductor chip or lower section of the assembly to be encapsulated. In connection with another embodiment of the present invention, the encapsulant barrier can be spaced from the lower surface of the assembly to be encapsulated. This can be accomplished by the use of a spacer or any other suitable means.

In accordance with yet another embodiment of the present invention, a semiconductor chip assembly or other component can be encapsulated by placing an encapsulant barrier adjacent the semiconductor chip assembly, such that an encapsulation area is least partially defined, and disposing a preform of encapsulation material in or adjacent the encapsulation area. The preform is of a predetermined volume which is equal to or less than the encapsulation area, such that when the preform is liquified as part of the method the encapsulation material will not flow out of the encapsulation area to possibly affect the integrity of the exposed terminals. In this embodiment, a protective barrier is not required, although it may be employed to ensure that the encapsulation material does not contact the exposed terminals or that any of the manipulation of the assembly while practicing this method will not affect the integrity of the exposed terminals.

The encapsulant can be provided as a preform which can be liquified by heating, and hardened by cooling, either directly or permitting the material to cool on its own. It is also preferable that the preform be extruded or injection molded to the predetermined volume. The preform can be in the form of an elongated bead with a circular cross section, or any other suitable form or shape.

In still another embodiment of the present invention, a semiconductor chip assembly having a top layer with exposed terminals can be simultaneously provided with elastomeric layer and encapsulated. The matter in accordance with the present invention includes placing an encapsulation barrier adjacent the semiconductor chip assembly, such that the encapsulation barrier at least partially defines an encapsulation area, introducing an encapsulation material into the gap between the semiconductor chip and the top layer of the semiconductor chip assembly, such that the encapsulation material is disposed between the top layer and the semiconductor chip, and introducing an encapsulation material into a portion of the encapsulation and providing a protective barrier for protecting the terminals on the top layer of the semiconductor chip assembly.

Preferably, the encapsulation material utilized to fill the gap between the top layer and the semiconductor chip in the same encapsulation material used to fill at least a portion of the encapsulation area. In this instance, the step of introducing the encapsulating material into at least a portion of the encapsulation area may be a continuation of introducing the encapsulation into at least a portion of the gap. Also preferable in this and other embodiments of the present invention, the encapsulation material is an elastomer. Still further, and in accordance with the last described method, the preferential steps of materials and components discussed above in connection with other embodiments of the present invention can also be employed in connection with this method. This last described method of simultaneously forming a layer between the top layer and semiconductor chip and encapsulating the semiconductor chip assembly preferably includes supporting the top layer above the semiconductor chip. This supporting step may be particularly important where a protective barrier is to be provided to protect the exposed terminals on the top layer of the semiconductor chip assembly.

DETAILED DESCRIPTION OF THE PREFERRED EMBODIMENTS

Figure 1:
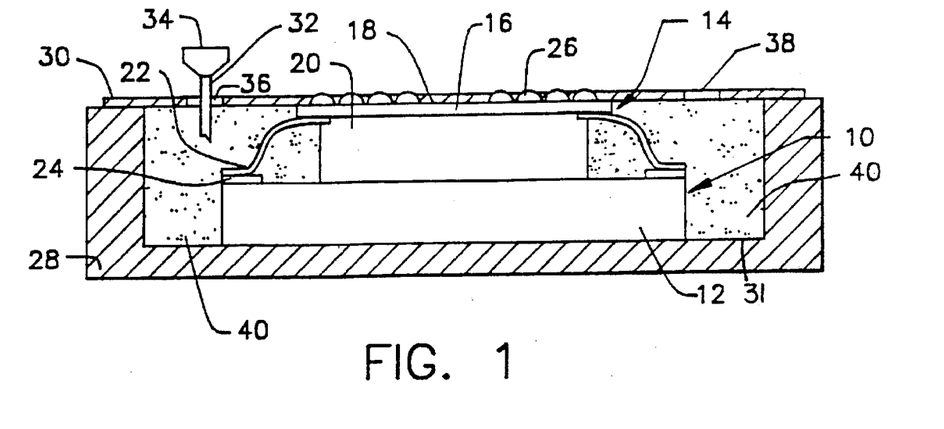
FIG. 1 is an elevational view, in partial section, illustrating a semiconductor chip assembly as it is being encapsulated within a can in accordance with one embodiment of the present invention.
Figure 6:
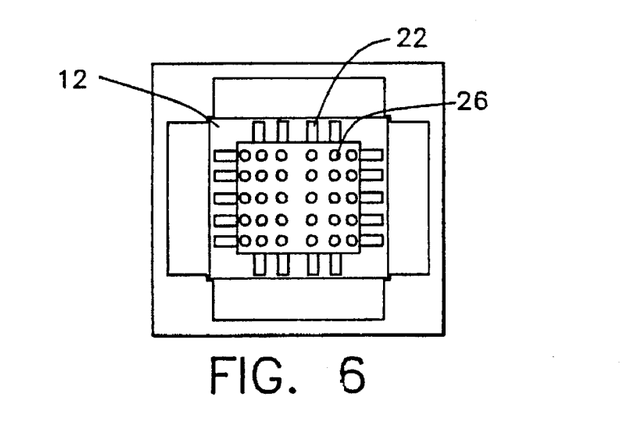
FIG. 6 is a top plan view of a semiconductor chip assembly positioned within a can having a centering structure.

Referring to FIG. 1, a semiconductor chip assembly, generally designated as 10, includes a semiconductor chip 12 and a chip carrier 14. The chip carrier 14 is made up of a top layer 16 (preferably a polyimide layer or the like) and an elastomeric pad 20 disposed between the top layer 16 and the semiconductor chip 12. The semiconductor chip 12 and the chip carrier 14 are electrically connected via a plurality of leads 22 which are connected to the chip 12 via contacts 24. The leads 22 are electrically connected to terminals 26 which protrude as "bumps" from the top surface 18 of the chip carrier 14. This assembly may, for example, be in accordance with commonly assigned U.S. Pat. Nos. 5,148,266; 5,258,330 and 5,148,265. The arrangement of the leads 22 and the array of terminals 26 can be seen more clearly in the plan view of the semiconductor chip assembly of 10 shown in FIG. 6, although any arrangement of leads and terminals might form part of a given semiconductor chip assembly or other component to which the present invention is applicable. It is the terminals 26 which connect the semiconductor chip assembly 10 to a printed circuit board or other substrate (not shown), and thus it is critical that the integrity of the terminals 26 must be preserved throughout testing and final assembly.

The semiconductor chip assembly 10 is, in FIG. 1, positioned for encapsulation within a can 28. The can 28, in this embodiment, will form part of the encapsulation, and preferably will serve as a heat sink for the semiconductor chip assembly 10. Thus, the can 28 is preferably made of a material which is high in thermal conductivity, depending upon the specific component and its application. Aluminum is preferable in most instances. The can has a surface 31 fastened to the rear or bottom face of chip 12 by thermally conductive adhesive such as a silver-filled epoxy (not shown).

Figure 4:
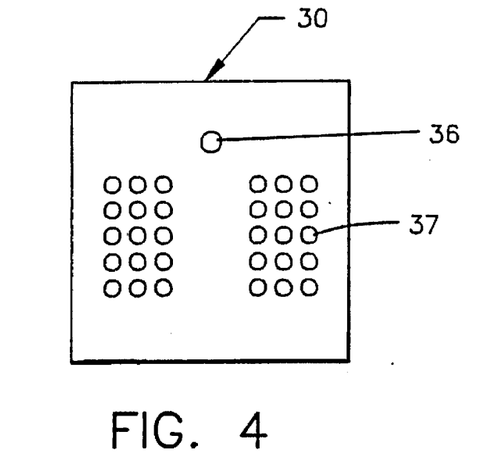
FIG. 4 is a top plan view of a solder mask which can be used in accordance with different embodiments of the present invention.

FIG. 1 shows the use of a solder mask 30 which is in contact with and preferably connected to the top side of the walls of can 28 and the top surface 18 of the chip carrier 14. While the solder mask 30 could merely have a large opening through which the array of terminals 26 are exposed, the solder mask 30 being connected to the perimeter of the top surface of chip carrier 14, it is preferable to provide solder mask 30 with an array of terminal holes corresponding to the array of terminals 26 on the chip carrier 14. The array of terminal holes 37 is shown clearly in FIG. 4. The terminal holes 37 can be registered with the terminals 26, and are preferably of such a size that the solder mask 30 must be pressed over the terminals 26. This provides a relatively tight fit of the terminals 26 in the terminal holes of the solder mask 30. The solder mask can be attached to the top edge of the walls of can 28 and the top surface 18 of the chip carrier 14 by a vacuum lamination method, using heat and pressure to secure the solder mask 30 in place. Any other suitable method of attachment can be used. The solder mask 30 is preferably made of a dielectric material, such as a film selected from the group consisting of release film, ½ mil adhesive and ½ mil polyimide or stand-alone adhesive with release film on each side which can be vacuum laminated. Since its dielectric properties will be advantageous when the terminals 26 are employed during testing or final assembly. A photosensitive polymer film may be employed to permit formation of holes 37 by photographic processor. The preferred material for the solder mask 30 is Dupont VACREL 8100, which exhibits the desirable photosensitive and dielectric properties.

Once the semiconductor chip assembly 10 has been positioned within the can 28, and the solder mask 30 has been secured to protect the terminals 26 from the encapsulation material, the encapsulation material can be introduced into the encapsulation area, which, in most instances, about the periphery of the semiconductor chip assembly 10. This can be accomplished in a number of ways, including most preferably, the use of a needle 32 which is connected to a source 34. Thus, the needle is inserted into a fill hole 36 in the solder mask 30, there being a vent hole 38 as well, if required. The encapsulation material 40 is either injected into the encapsulation area or may, in connection with certain embodiments of the present invention, be conveyed or "pulled" from needle 32 by the capillary-like relationship of the encapsulation material 40 to the semiconductor chip assembly 10, causing the wetting of the surfaces of the semiconductor chip assembly 10. The latter method of introduction depends, of course, upon the type of encapsulation material 40 used.

The encapsulation material 40 can be of any suitable material, but preferably is a silicone resin, and in the preferred embodiment of the present invention it is a curable silicone-based encapsulant such as DC577, which is manufactured by Dow Corning Corporation of Midland, Mich. The encapsulation material 40 can be cured or partially cured in any suitable fashion, such as exposure to radiant energy, thermal energy or ultraviolet light. Several ways in which to cure materials are disclosed in the '882 application.

Figure 2:
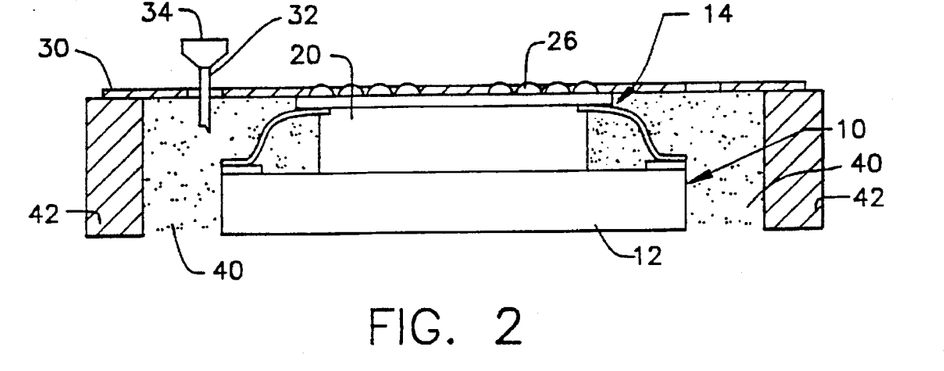
FIG. 2 is an elevational view, in partial section, of a semiconductor chip assembly being encapsulated within a ring in accordance with another embodiment of the present invention.

FIG. 2 illustrates a semiconductor chip assembly 10 as positioned within a ring 42, which is essentially a wall disposed about the periphery of the semiconductor chip assembly 10. In this case, a separate type of heat sink might be applied to the bottom surface of the chip 12 (as opposed to the bottom of the can 28 as shown in FIG. 1). Thus, there is an opening between the ring 42 and the chip 12 in the arrangement shown in FIG. 2. This opening might be closed for purposes of encapsulation by a mold, support surface or other substrate. In the alternative, the encapsulation material 40 might be chosen to operate on the basis of capillary action, thus wetting the surfaces and limiting and terminating flow based on surface tension (as illustrated in FIG. 10C with respect to a different embodiment of the present invention). This would prevent the encapsulation material from flowing out of the encapsulation area.

Figure 3:
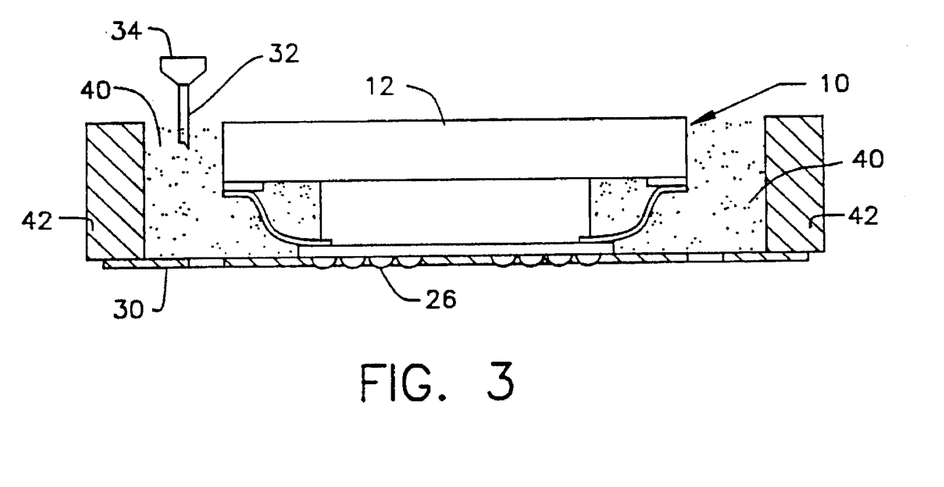
FIG. 3 is an elevational view, in partial section, illustrating a semiconductor chip assembly being encapsulated in an inverted position within a ring in accordance with another embodiment of the present invention.

Yet another alternative would be to invert the structure shown in FIG. 2, but without a fill or vent hole in the solder mask 30, as shown in FIG. 3. Thus, the opening between the ring 42 and the chip 12 will be used in order to fill the encapsulation area with the needle 32 or any other suitable means.

Figure 5:
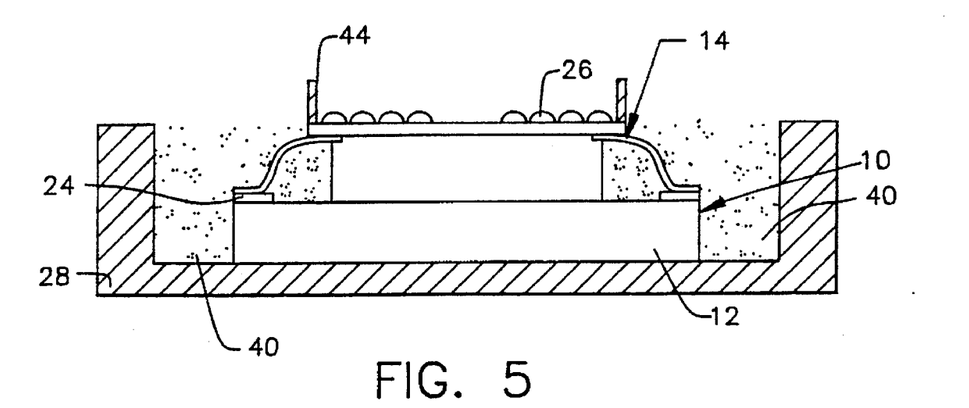
FIG. 5 is an elevational view, in partial section, illustrating the encapsulation of the semiconductor chip assembly within a can in accordance with another embodiment of the present invention.

FIG. 5 illustrates yet another embodiment by which the terminals 26 on the chip carrier 14 can be protected from the encapsulation material 40. In this embodiment, a peripheral dam 44, which essentially consists of a wall disposed about the periphery of the top surface of chip carrier 14. This wall might be temporarily fixed to the top surface of the chip carrier 14, or, more preferably, will be a metal or plastic dam which is maintained in place on top of the chip carrier 14 by its own weight. The dam 44 will prevent the flow of the encapsulation material towards the terminals 26 on the chip carrier 14. Once the encapsulation area has been filled, the dam 44 can be removed. The dam 44 might also be in the form of a cap or cover which can be placed on the chip, carrier 14, and subsequently removed.

Figure 8:
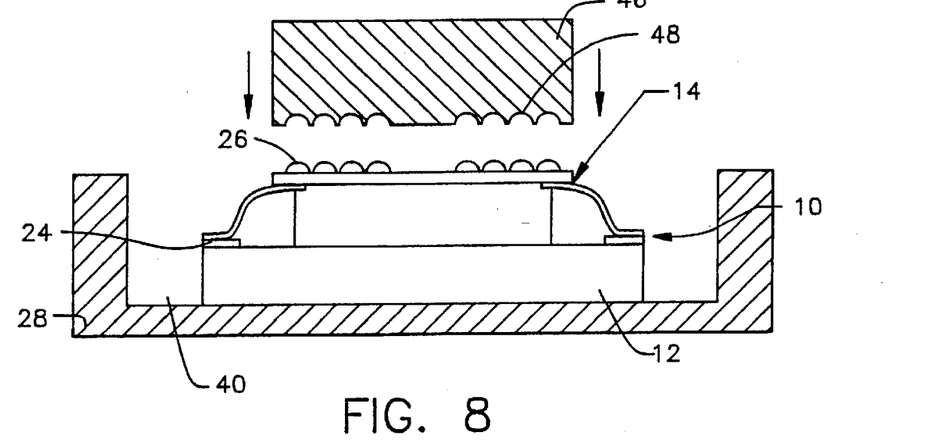
FIG. 8 is an elevational view of a semiconductor chip assembly being prepared for encapsulation within a can, illustrating in particular the use of a terminal cap or cover in accordance with another embodiment of the present invention.

The embodiment shown in FIG. 8 is similar to the use of a dam 44 or a cover. It provides a shield 46 which includes an array of dimples 48 which matches the array of terminals 26. The shield 46 can be made of any suitable material. The concept of a shield can also be applied by utilizing a rubber shield which need not provide dimples 48, but rather will rely upon the deformability of the rubber material to surround and protect the terminals 26. Of course, in using such a rubber shield, some pressure must be applied in order to cause the rubber material to surround the terminals 26, particularly the terminals 26 around the periphery the chip carrier 14.

Figure 7:
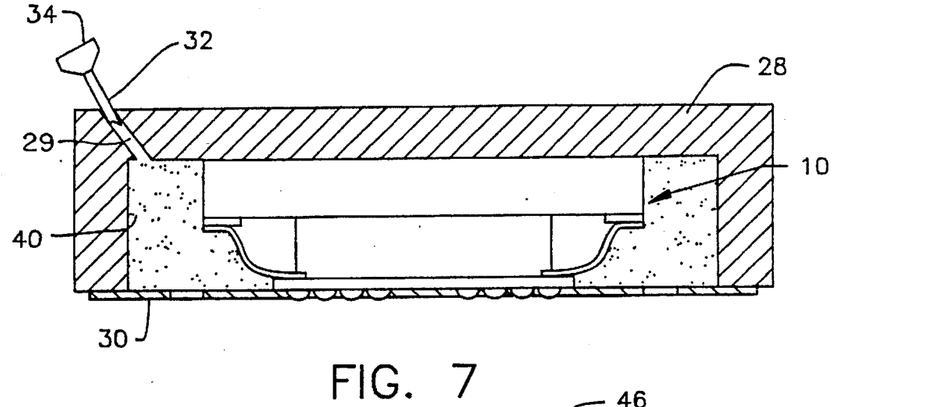
FIG. 7 is an elevational view, in partial section, illustrating the encapsulation of a semiconductor chip assembly in an inverted position within a can in accordance with another embodiment of the present invention.

FIG. 7 shows yet another embodiment of a semiconductor chip assembly 10 within a can 28 and employing a solder mask 30. In this embodiment, the needle 32 is inserted into a fill hole 29 in the can 28 while the entire assembly is in the inverted position. Again, as in the embodiment shown in FIG. 1, a vent hole might be necessary in the can 28 so that air does not become trapped in the encapsulation area.

Figure 9:
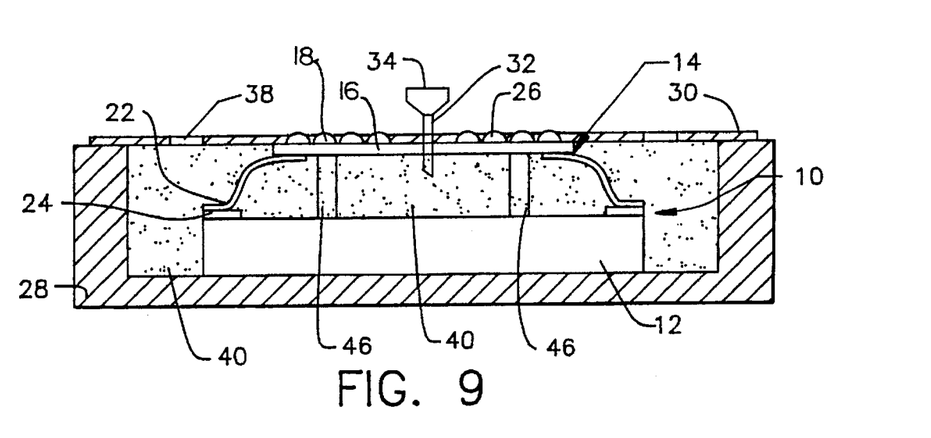
FIG. 9 is an elevational view, in partial section, illustrating the simultaneous formation of an elastomeric pad and the encapsulation of a semiconductor chip assembly in accordance with another embodiment of the present invention.

FIG. 9 is yet another embodiment of the present invention by which an elastomeric layer is formed between the top layer 16 of the chip carrier 14 and the chip 12 simultaneously with the encapsulation of the semiconductor chip assembly 10. The chip carrier top layer 16 is initially connected to the chip by bonding leads 22 to the contacts of the chip, so that the top layer is supported about the chip surface by the leads. Such a procedure is disclosed for example in U.S. application Ser. No. 08/123,882 filed on Sep. 20, 1993 by Sweis et al. ("the '882 application), now U.S. Pat. No. 5,477,611. The '882 application discloses a method of interfacing a chip carrier and a semiconductor chip, as well as providing an elastomeric layer. The disclosure of the '882 application is incorporated herein by reference, although it should be recognized that the present invention is applicable in connection with methods and semiconductor chip assemblies of any type and in addition to those disclosed in the '882 application. Initially, as in the other embodiments, the solder mask 30 is attached to the top side of the can 28 and the top surface 18 of the chip carrier 14. It is preferable, particularly when the solder mask 30 is to be vacuum laminated to the top surface of the chip carrier 14, that the chip carrier 14 be supported above the chip 12 by outer structures in addition to leads 22 so that the integrity of the leads 22 and the connection of such leads to the chip 12 and the chip carrier 14 are not affected during lamination of the solder mask 30. Supports 46, in the form of posts, are shown in FIG. 9 between chip carrier 14 and chip 12. These posts are disposed on chip 12 before assembly of layer 16. The solder mask 30 is laminated to the top side of the can walls and the top surface 18 of the chip carrier 14. As in other embodiments, the solder mask 30 might include a vent hole 38 to prevent air from becoming within the encapsulation area or within the elastomeric layer area. A needle 32 is then inserted through aligned apertures in the chip carrier 14 and the solder mask 30, and the encapsulation material 40 is either injected into the gap between layer 16 and chip 12. As discussed in detail in the '882 application, the elastomeric material can convey itself through the gap area by capillary action.

Figure 10A:
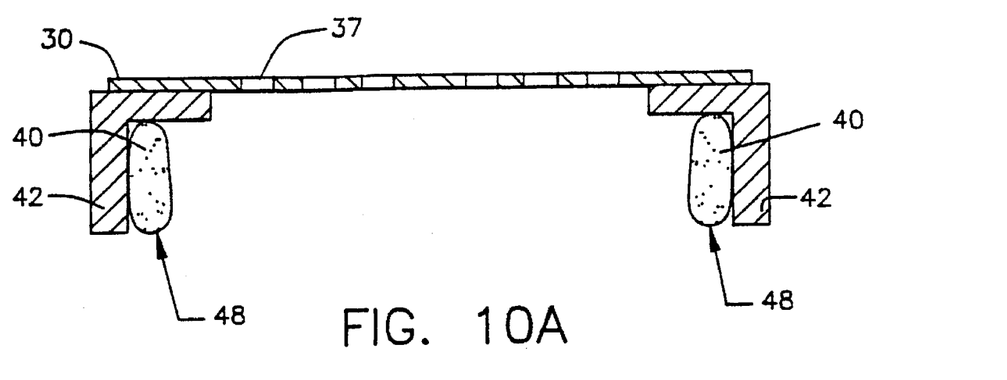
FIG. 10A is an elevational view; in section, illustrating a ring, solder mask and preform arranged to facilitate the encapsulation of a semiconductor chip assembly in accordance with another embodiment of the present invention.
Figure 10B:
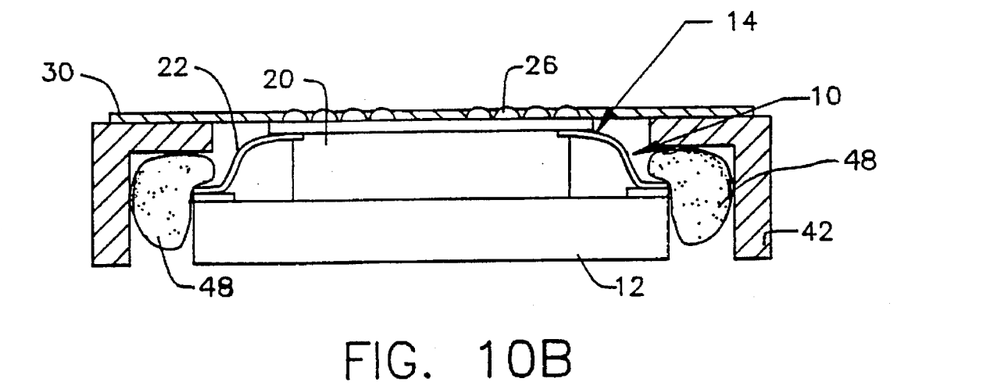
FIG. 10B is an elevational view, in partial cross section, of the ring, solder mask and preform in FIG. 10A, as arranged in association with a semiconductor chip assembly in preparation for encapsulation.
Figure 10C:
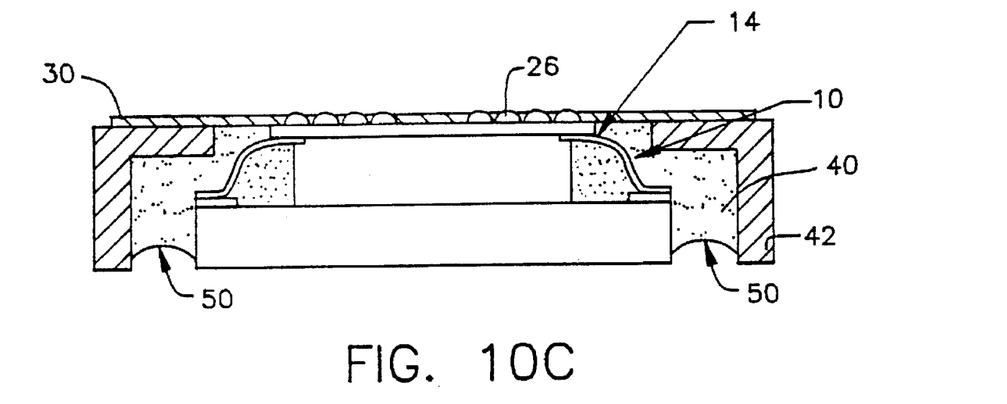
FIG. 10C is an elevational view, in partial section, illustrating the liquification of the preform shown in FIG. 10B to encapsulate the semiconductor chip assembly within the ring.

FIGS. 10A–10C illustrate the steps taken in accordance with yet another embodiment of the present invention. Generally, this embodiment relates to the use of a preform 48 of the encapsulation material In other words, the encapsulation material 40 can be arranged in or adjacent the encapsulation area in a non-liquid state, so that the encapsulation material 40 can flow into or throughout the encapsulation area upon application of heat or any other expedient appropriate for a given encapsulation material. This concept can be employed in connection wish any other embodiment of the present invention, and is not limited to the specific steps shown in FIGS. 10A–10C.

In FIG. 10A and 10B, the preform 48 is provided around the inside of a can 42 which is to surround a chip assembly 10. The can 42 has an inverted L-shaped profile in this embodiment, but can take on any appropriate shape. A solder mask 30 is provided, and includes terminal holes 37 for registration with the terminals 26 of a chip assembly 10. The solder mask 30 is secured to the top side of the can 42, by vacuum lamination or any other method of attachment, either before or after association with the chip assembly 10. The structure in FIG. 10A is then married with a semiconductor chip assembly 10, the terminals 26 being pressed through the terminal holes 37. As shown in FIG. 10B, the preform 48 might be deformed somewhat by the peripheral portions of the chip assembly 10.

In FIG. 10C, the melting of the preform 48, and the flowing of the encapsulation material 40 is illustrated. As shown in FIG. 10C, a meniscus 50 is formed in the opening between the can 42 and the assembly 10, thus preventing the encapsulation material 40 from flowing out of the encapsulation area. It is noted that the encapsulation material 40 must be, in the illustrated embodiment, one which works by capillary action and exhibits sufficient surface tension to form the meniscus and prevent the further flow of the encapsulation material 40. On the other hand, the structure shown in FIG. 10B can be inverted and the preform can be subjected to heat, thus melting the preform 48, whereupon the encapsulation material 40 will fill the encapsulation area by gravity.

Figure 11:
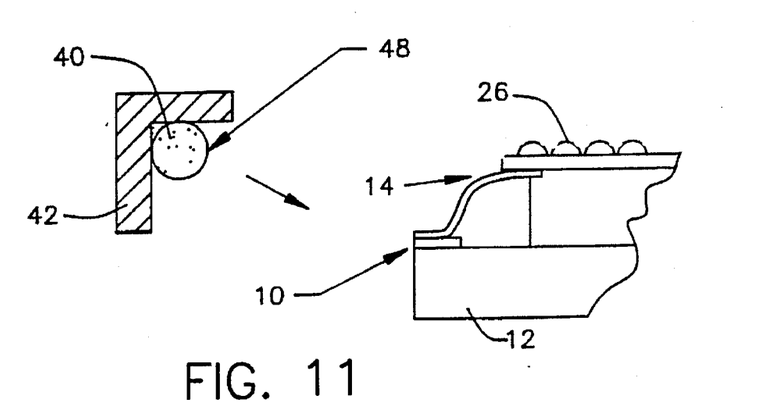
FIG. 11 is a partial elevational view, in partial section, of a preform of predetermined volume associated with a ring as it is being arranged in association with a semiconductor chip assembly for the encapsulation of such semiconductor chip assembly in accordance with another embodiment of the present invention.

The melting of the preform 48 when the structure is in the inverted position lends itself to the use of a preform 48 of a specific volume that will fill the encapsulation area, but will not overflow out of the encapsulation area. Such a preform 48 is shown in FIG. 11 disposed in connection with a can 42 having an L-shaped profile. Unlike FIGS. 10A–110C, the structure in FIG. 11 does not show the use of a solder mask or other physical barrier to protect the terminals 26. Rather, the preform 48 is of such a volume that it will fill only the encapsulation area. Of course, both measures of protecting the terminals 26 can be employed (i.e., a physical barrier and a preform of predetermined volume). Thus, the encapsulation area must be calculated, and an appropriately sized preform must be provided. The preform can be a bead of encapsulation material formed by extrusion or injection molding or any other means. It must, however, be relatively uniform in size so that an appropriate amount of encapsulation material flows in every area about the periphery of the chip assembly 10, yet does not overfill the encapsulation area at any point.

The heating of the preform in any of the previously discussed embodiments can be accomplished heating the lower surface of the chip 12 in a vacuum oven. In order to control the flow of the encapsulation material and prevent damage to the chip carrier 14, the top of the assembly might be cooled to reduce radiant heat.

Figure 12:
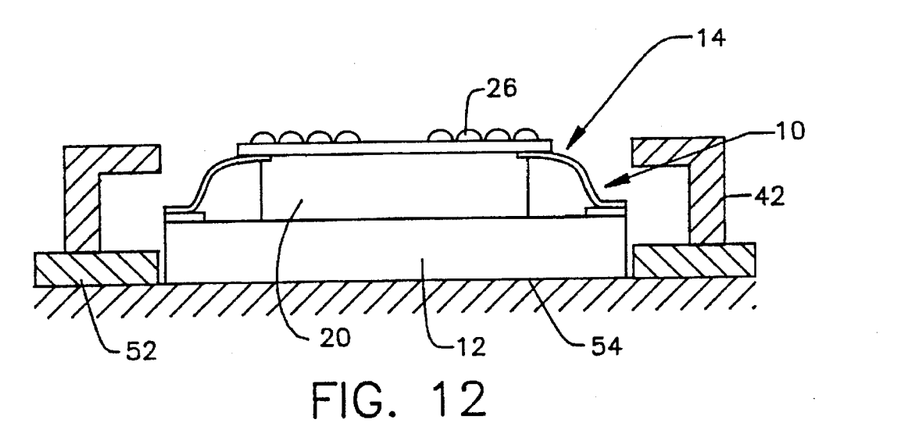
FIG. 12 is an elevational view, in partial section, of a semiconductor chip assembly as it is being prepared for encapsulation within a ring, illustrating in particular the use of a spacer in accordance with another embodiment of the present invention.

In FIG. 12, a semiconductor chip assembly 10 is shown on a support surface 54, and surrounded by a ring 42. As the ring is not high enough to be flush with the top surface of the chip carrier 14, a spacer 52 is provided about the periphery of the chip assembly 10 and under the ring 42.

Figure 13:
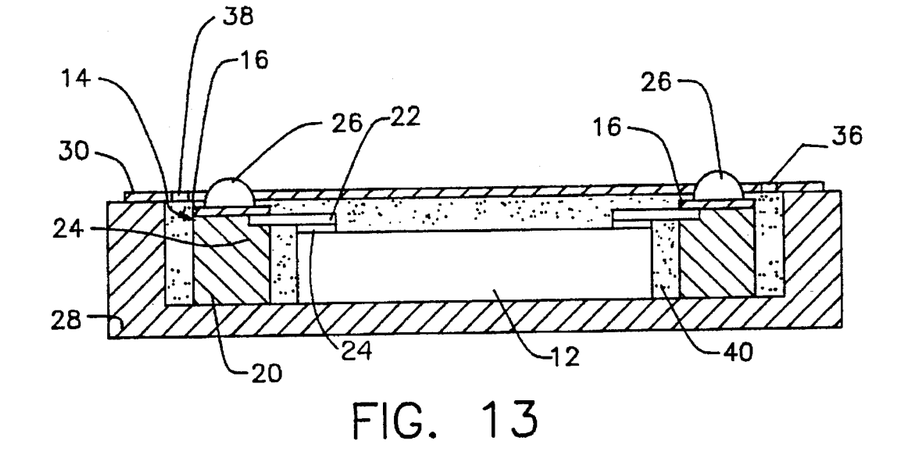
FIG. 13 is an elevational view, in partial section, of a semiconductor chip as it is being prepared for encapsulation within a can, illustrating in particular the leads being directed inwardly from the elastomeric pad to the contacts.

A further embodiment is shown in FIG. 13, revealing that the present invention contemplates arrangements which differ from the arrangement set forth above. Specifically, in FIG. 13, the semiconductor chip 12 is surrounded by a chip carrier 14, which is preferably formed by a top layer 16 and an elastomeric pad 20. In this case, the chip carrier 14 surrounds the semiconductor chip 12, and the leads 22 from the chip carrier 14 are directed inwardly and are connected to the semiconductor chip 12 via contacts 24. As with previous embodiments, this assembly can be encapsulated as shown in any of the previous embodiments. In FIG. 13, this assembly is positioned with a can 28 for encapsulation. Although any of the previously-described methods might be suitable for encapsulating the assembly in FIG. 13, the use of the solder mask 30 over the terminals or bumps 26 is illustrated. The solder mask 30 includes a fill hole 36 for purposes of inserting the encapsulation material, as well as a vent, hole 38.

The present invention can be applied in encapsulating any structure, whether the leads fan in, fan out or both. Any of the structure and arrangements illustrated and described in commonly assigned U.S. Pat. No. 5,148,265, the disclosure incorporated herein by reference, can be encapsulated in accordance with the present invention.

While the foregoing description and figures illustrate some preferred embodiments of the method in accordance with the present invention, it should be appreciated that certain, modifications may be made and are encouraged to be made in the steps, structure, arrangement and materials of the disclosed embodiments, particularly as may be applicable from the disclosure incorporated herein by reference, without departing from the spirit and scope of the present invention which is defined by the claims which are set forth immediately hereafter.

We claim:

1. A method of encapsulating a semiconductor chip assembly having a top layer with an array of exposed terminals thereon, the terminals being electrically connected to the chip, said method comprising the steps of:

placing an encapsulant barrier adjacent the semiconductor chip assembly, said encapsulant barrier at least partially defining an encapsulation area;

providing a protective barrier in contact with said top layer for protecting the terminals on the top layer from an encapsulation material; and introducing an encapsulation material into at least a portion of the encapsulation area so that the encapsulation material flows to fill the encapsulation area and then cures to a substantially solid condition, the protective barrier preventing the encapsulation material from contacting the terminals on the top layer.

2. The method in claim 1, wherein said encapsulation material is a curable material which is in liquid form when introduced into said encapsulation area.

3. The method in claim 2, further comprising the step of curing said curable material after said curable material has been introduced into said encapsulation area.

4. The method in claim 3, wherein the curing step includes heating said curable material.

5. The method in claim 3, wherein the step of curing includes mixing a plurality of mutually reactive material to form said curable materials during or before said curable material is introduced into said encapsulation area, whereby said curable material is at least partially cured by reaction of said mutually reactive materials.

6. The method in claim 3, wherein said curable material is a curable elastomer.

7. The method in claim 1, wherein said introducing step includes step of introducing a preform into said encapsulation area.

8. The method in claim 7, wherein said introducing step includes heating said preform so that it liquefies and said encapsulation material flows substantially throughout the encapsulation area.

9. The method in claim 1, wherein said placing step includes placing said encapsulant barrier a spaced distance from the periphery of said semiconductor chip.

10. The method in claim 1, wherein said encapsulant barrier in said placing step is at least a portion of a mold, and further comprising the step of removing the mold after the encapsulation material is at least partially cured.

11. The method in claim 1, wherein said encapsulant barrier in said placing step is at least a portion of a can which forms part of a package for the chip assembly, said can being secured to said chip subassembly.

12. The method in claim 11, wherein said can includes a bottom in contact with the semiconductor chip and a wall extending upwardly from said bottom about the periphery of said semiconductor chip.

13. The method in claim 12, wherein said can, is made from aluminum or an aluminum alloy.

14. The method in claim 12, further comprising the step of positioning said semiconductor chip assembly within said can via positioning means in said can.

15. The method in claim 14, wherein said step of positioning includes centering said semiconductor chip assembly via said positioning means.

16. The method in claim 1, wherein said encapsulant barrier in said placing step is at least a portion of a ring which forms part of a package for the chip, said ring having a wall extending upwardly alongside said semiconductor chip assembly.

17. The method in claim 1, wherein the introducing step is done before the placing step and includes associating a preform of an encapsulation material with the protecting barrier.

18. The method in claim 17, wherein the providing step is done before the placing step.

19. The method in claim 18, wherein said encapsulant barrier is a ring.

20. The method in claim 1, wherein said top layer includes a top surface on which the array of terminals is disposed, and said barrier includes a dam extending upwardly from said top surface.

21. The method in claim 20, wherein said providing step includes attaching said dam to said top surface.

22. The method in claim 1, wherein said top layer includes a top surface on which the array of terminals are disposed, said protective barrier includes a sheet like mask, and said providing step includes attaching said mask to said top surface of said top layer and to said encapsulant barrier such that said mask extends over said encapsulation area.

23. The method as claimed in claim 22, wherein said encapsulant barrier includes a top edge substantially encircling said subassembly and said mask extends from said top surface of said top layer to said top edge of said encapsulant barrier.

24. The method in claim 22, wherein said sheet like mask includes at least one opening in which the array of terminals are exposed.

25. The method in claim 22, wherein said sheet like mask includes an array of terminal openings corresponding to said array of terminals on said top layer, and wherein said providing step includes aligning said array of terminal openings with said array of terminals prior to attaching said mask to said top surface so that said terminals are exposed above said mask.

26. The method in claim 25, wherein each of said array of terminal holes is sized such that said terminals fit closely in said terminal holes.

27. The method in claim 26, wherein said mask is a dielectric.

28. The method in claim 27, wherein said mask is an epoxy acrylic.

29. The method in claim 22, wherein the providing step includes vacuum lamination of said mask to said top surface of said top layer and said encapsulant barriers.

30. The method in claim 29, wherein said mask includes a fill hole communicating with said encapsulation area, and wherein said introducing step includes introduction of said encapsulant material via said fill hole.

31. The method in claim 30, wherein said mask includes a vent hole communicating with said encapsulation area so that air does not become trapped in said encapsulation area during said introducing step.

32. The method in claim 22, wherein said encapsulant barrier includes a fill hole, and said introducing step includes introduction of said encapsulation material via said fill hole.

33. The method in claim 1, wherein said top layer is a spaced distance above said semiconductor chip, and further comprising the step of supporting said top layer above said semiconductor at least during said providing step.

34. The method in claim 33, wherein said step of supporting said top layer includes providing a compliant layer between said top layer and said chip.

35. The method in claim 1, wherein said protective barrier is a cap which engages by said top layer and covers said terminals.

36. The method in claim 35, wherein said cap is metal.

37. The method in claim 35, wherein said cap is plastic.

38. The method in claim 35, wherein said cap is flexible and is forced against said top layer to prevent encapsulation material from contacting said terminals.

39. The method in claim 1, wherein said encapsulant barrier is a ring having a top side, and further comprising the step of supporting said semiconductor chip assembly on a support surface and spacing said ring from said support surface such that the top side of said ring is at approximately the same height as the top surface of said top layer.

40. The method in claim 39, wherein said spacing step includes the positioning of a spacer on said support surface adjacent said semiconductor chip assembly.

41. A method of encapsulating a semiconductor chip assembly having a top layer with an array of exposed terminals electrically connected to the chip, said method comprising the steps of:

placing an encapsulant barrier adjacent the semiconductor chip assembly, said encapsulant barrier at least partially defining an encapsulation area;

disposing a preform made of an encapsulation material in said encapsulation area, said preform normally being in a substantially solid state and being meltable to a temporary liquid state, said preform being of a predetermined volume which is equal to or less than the volume of said encapsulation area; and liquifying said preform so that said encapsulation material flows substantially throughout said encapsulation area, but does not flow out of said encapsulation area, at least in the area of the exposed terminals.

42. The method in claim 41, wherein said encapsulation material is curable, and further comprising the step of hardening said encapsulation material after said encapsulation material has flowed substantially throughout said encapsulation area.

43. The method in claim 42, wherein the liquifying step includes heating said preform, and said hardening step includes cooling said encapsulation material or allowing said encapsulation material to cool to the ambient temperature.

44. The method in claim 41, wherein said preform is an extruded or injection molded bead of said encapsulation material.

45. The method in claim 41, wherein said placing step includes placing said encapsulant barrier a space distance from the periphery of said semiconductor chip.

46. The method in claim 41, wherein said encapsulant barrier is at least a portion of a can which forms part of a package for the chip.

47. The method in claim 41, wherein said encapsulant barrier is at least a portion of a ring which forms part of a package for the chip.

* * * * *

UNITED STATES PATENT AND TRADEMARK OFFICE
CERTIFICATE OF CORRECTION

PATENT NO. : 5,663,106
DATED : September 2, 1997
INVENTOR(S) : Karavakis et al.

It is certified that error appears in the above-identified patent and that said Letters Patent is hereby corrected as shown below:

Column 1, line 60, change "materials" to read -- material --.

Column 5, line 22, after the word "assembly" delete "of".

Column 7, line 65, after the word "material" insert --40.--

Column 8, line 4, change "wish" to read -- with --.

Column 8, line 56, after the word "accomplished" insert -- by --.

Column 9, line 15, after the word "vent" delete the comma.

Column 9, line 20, before the word "incorporated" insert -- of which is --.

Column 9, line 25 after the word "certain" delete the comma.

Column 10, line 20, after the word "can" delete the comma.

Column 10, line 49, change "sheet like" to read -- sheetlike --.

UNITED STATES PATENT AND TRADEMARK OFFICE
CERTIFICATE OF CORRECTION

PATENT NO.  :   5,663,106
DATED       :   September 2, 1997
INVENTOR(S) :   Karavakis et al.

It is certified that error appears in the above-identified patent and that said Letters Patent is hereby corrected as shown below:

Column 10, line 58, change "sheet like" to read -- sheetlike --.

Column 10, line 61, change "sheet like" to read -- sheetlike --.

Signed and Sealed this

Tenth Day of February, 1998

Attest:

BRUCE LEHMAN

*Attesting Officer*    *Commissioner of Patents and Trademarks*

(12) EX PARTE REEXAMINATION CERTIFICATE (9303rd)
United States Patent
Karavakis et al.

(10) Number: US 5,663,106 C1
(45) Certificate Issued: Sep. 18, 2012

(54) METHOD OF ENCAPSULATING DIE AND CHIP CARRIER

(75) Inventors: Konstantine Karavakis, Coram, NY (US); Thomas H. Distefano, Monte Sereno, CA (US); John W. Smith, Jr., Austin, TX (US); Craig Mitchell, San Jose, CA (US)

(73) Assignee: Tessera, Inc. (A Corp. of Delaware), San Jose, CA (US)

Reexamination Request:
No. 90/009,215, Jul. 18, 2008

Reexamination Certificate for:
Patent No.: 5,663,106
Issued: Sep. 2, 1997
Appl. No.: 08/246,113
Filed: May 19, 1994

Certificate of Correction issued Feb. 10, 1998.

(51) Int. Cl.
*H01L 21/56* (2006.01)
*H01L 21/60* (2006.01)

(52) U.S. Cl. ............. 29/841; 257/E21.502; 257/E23.14; 257/791; 264/272.17; 438/126; 438/127

(58) Field of Classification Search .................. 29/841; 257/786, 791; 264/272.11; 438/126, 127
See application file for complete search history.

(56) References Cited

To view the complete listing of prior art documents cited during the proceeding for Reexamination Control Number 90/009,215, please refer to the USPTO's public Patent Application Information Retrieval (PAIR) system under the Display References tab.

*Primary Examiner* — Jimmy G Foster (57) ABSTRACT

A method of packaging a semiconductor chip assembly includes the encapsulation of the same after establishing an encapsulation area and providing a physical barrier for protecting the terminals of a chip carrier. An alternative or supplement to providing a physical barrier is to provide a preform of an encapsulation material which includes a predetermined volume of such material so that only the encapsulation area is filled. For a semiconductor chip assembly which does not yet have an elastomeric layer, a method of simultaneously forming such as elastomeric layer and encapsulating a semiconductor chip assembly is also provided.

At the time of issuance and publication of this certificate, the patent remains subject to pending reissue application numbers 13/173,527 and 13/176,140 filed 6/30/2011 and 7/5/2011 respectively. The claim content of the patent may be subsequently revised if a reissue patent is issued from the reissue applications.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 5, line 7:

*For ease of reference, directions are stated in this disclosure with reference to the top side of chip 12. The top side of the chip 12 is that on which contacts 24 are disposed. Generally, directions referred to as "upward" or "rising from" shall refer to the direction orthogonal and away from the chip top surface. Directions referred to as "downward" shall refer to the directions orthogonal to the chip top surface and opposite the upward direction. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.*

AS A RESULT OF REEXAMINATION, IT HAS BEEN DETERMINED THAT:

Claims 1-4, 9, 10 and 33-35 are cancelled.

New claims 48-51 are added and determined to be patentable.

Claims 5-8, 11-32 and 36-47 were not reexamined.

48. *A method of encapsulating a semiconductor chip assembly including a chip having a top surface with contacts and a top layer extending over the top surface of the chip so that a bottom surface of the top layer faces toward the top surface of the chip and a top surface of the top layer faces away from the top surface of the chip, the top layer having an array of exposed terminals thereon, the semiconductor chip assembly further including leads, said leads having contact ends bonded to said contacts, the terminals being electrically connected to the chip by said leads, said method comprising the steps of:*

*placing an encapsulant barrier adjacent the semiconductor chip assembly, said encapsulant barrier at least partially defining an encapsulation area;*

*providing a protective barrier in contact with said top surface of said top layer so that said protective barrier extends over said top layer and over said top surface of said chip for protecting the terminals on the top layer from an encapsulation material; and*

*introducing an encapsulation material into at least a portion of the encapsulation area so that the encapsulation material flows to fill the encapsulation area and then cures to a substantially solid condition, the protective barrier preventing the encapsulation material from contacting the terminals on the top layer, said step of introducing an encapsulation material being performed so that said encapsulant covers said contact ends of said leads,*

*wherein said leads include wire bonds.*

49. *A method of encapsulating a semiconductor chip assembly including a chip having a top surface with contacts and a top layer extending over the top surface of the chip so that a bottom surface of the top layer faces toward the top surface of the chip and a top surface of the top layer faces away from the top surface of the chip, the top layer having an array of exposed terminals thereon, the semiconductor chip assembly further including leads, said leads having contact ends bonded to said contacts, the terminals being electrically connected to the chip by said leads, said method comprising the steps of:*

*placing an encapsulant barrier adjacent the semiconductor chip assembly, said encapsulant barrier at least partially defining an encapsulation area;*

*providing a protective barrier in contact with said top surface of said top layer so that said protective barrier extends over said top layer and over said top surface of said chip for protecting the terminals on the top layer from an encapsulation material; and*

*introducing an encapsulation material into at least a portion of the encapsulation area so that the encapsulation material flows to fill the encapsulation area and then cures to a substantially solid condition, the protective barrier preventing the encapsulation material from contacting the terminals on the top layer, said step of introducing an encapsulation material being performed so that said encapsulant covers said contact ends of said leads*

*wherein the terminals are disposed above the chip and in alignment with the chip*

*wherein, during said step of introducing an encapsulation material, said protective barrier contacts said top surface of said top layer but does not contact said bottom surface of said top layer.*

50. *A method of encapsulating a semiconductor chip assembly including a chip having a top surface with contacts and a top layer extending over the top surface of the chip so that a bottom surface of the top layer faces toward the top surface of the chip and a top surface of the top layer faces away from the top surface of the chip, the top layer having an array of exposed terminals thereon, the semiconductor chip assembly further including leads, said leads having contact ends bonded to said contacts, the terminals being electrically connected to the chip by said leads, said method comprising the steps of:*

*placing an encapsulant barrier adjacent the semiconductor chip assembly, said encapsulant barrier at least partially defining an encapsulation area;*

*providing a protective barrier in contact with said top surface of said top layer so that said protective barrier extends over said top layer and over said top surface of said chip for protecting the terminals on the top layer from an encapsulation material; and*

*introducing an encapsulation material into at least a portion of the encapsulation area so that the encapsulation material flows to fill the encapsulation area and then* cures to a substantially solid condition, the protective barrier preventing the encapsulation material from contacting the terminals on the top layer, said step of introducing an encapsulation material being performed so that said encapsulant covers said contact ends of said leads wherein the terminals are disposed above the chip and in alignment with the chip and wherein said top layer has an opening in alignment with said chip, and at least some of said leads extend into said opening to said contacts.

51. The method of claim 50 wherein at least some of said leads include partial leads disposed on said top layer and wire bonds extending into said opening to said contacts.

\* \* \* \* \*